United States Patent
Fleming

Patent Number: 6,005,344
Date of Patent: Dec. 21, 1999

[54] ORGANIC ELECTROLUMINESCENT IMAGE DISPLAY PANEL WITH MULTIPLE BARRIERS

[75] Inventor: Paul J. Fleming, Lima, N.Y.

[73] Assignee: Eastman Kodak Company, Rochester, N.Y.

[21] Appl. No.: 09/025,282

[22] Filed: Feb. 18, 1998

[51] Int. Cl.$^6$ ........................... H05B 33/12; H05B 33/14; H01J 1/62

[52] U.S. Cl. ........................... 313/498; 313/503; 313/504; 313/510

[58] Field of Search ........................... 313/235, 483, 313/492, 499, 500, 504, 505, 506, 512, 513; 345/44, 82

[56] References Cited

U.S. PATENT DOCUMENTS

| | | |
|---|---|---|
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 4,950,950 | 8/1990 | Perry et al. . |
| 5,047,687 | 9/1991 | VanSlyke . |
| 5,059,861 | 10/1991 | Littman et al. . |
| 5,059,862 | 10/1991 | VanSlyke et al. . |
| 5,061,617 | 10/1991 | Maskasky . |
| 5,294,869 | 3/1994 | Tang et al. ........................... 313/504 |
| 5,294,870 | 3/1994 | Tang et al. . |
| 5,701,055 | 12/1997 | Nagayama et al. ........................... 313/504 |
| 5,747,928 | 5/1998 | Shanks et al. ........................... 313/498 |
| 5,821,688 | 10/1998 | Shanks et al. ........................... 313/498 |

*Primary Examiner*—Vip Patel
*Assistant Examiner*—Matthew J. Gerike
*Attorney, Agent, or Firm*—Raymond L. Owens

[57] ABSTRACT

An organic electroluminescent (EL) image display panel is disclosed which has a light transmissive electrically insulative support, a plurality of parallel laterally spaced light transmissive anode electrodes disposed over a surface of the light transmissive electrically insulative support, a plurality of laterally spaced electrically insulative pedestal strips formed over the anode electrodes, a set of laterally spaced electrically insulative barriers disposed over corresponding pedestal strips, such that portions of each pedestal strip extend laterally beyond each set of barriers, said barriers projecting upwardly over each of the pedestal strips, an organic EL medium overlying each of said anode electrodes, the support, the upper surfaces of corresponding barriers, and extending beyond each of the barriers, and a plurality of parallel laterally spaced cathode electrodes overlying said organic EL medium.

13 Claims, 5 Drawing Sheets

ORGANIC ELECTROLUMINESCENT IMAGE DISPLAY PANEL WITH MULTIPLE BARRIERS

FIELD OF THE INVENTION

The present invention relates generally to organic electroluminescent image display panels and more particularly to such display panels having multiple electrically insulative barriers extending between selected image display regions.

BACKGROUND OF THE INVENTION

Organic electroluminescent display panels (hereinafter referred to as organic EL display panels) contain an image display array comprised of a plurality of light emitting pixels arranged in intersecting rows and columns.

In addition to the image display array, organic EL display panels may also contain display regions dedicated to the display of symbols or icons, such icon display regions disposed on a common support in a selected region adjacent to the image display array.

Tang et al., U.S. Pat. No. 5,294,870 disclose an organic EL multicolor image display device. For purposes of clarity, the multicolor aspect of the Tang et al. device will not be further discussed. In the construction of the Tang et al. device it has been found advantageous (see particularly FIG. 2) to provide a series of parallel walls 107 over a surface on a support, and extending orthogonally across a series of parallel first electrodes disposed on the support. Each single wall separates one set of pixels from an adjacent set of pixels. Each wall has substantially vertical side surfaces and a top surface extending in a direction parallel to the support. Each wall serves as an integral deposition mask for forming second electrodes (A, B, and C in FIG. 2) by line-of-sight vapor deposition of an electrode material under an angle relative to the substantially vertical side surfaces of the walls.

Nagayama et al., European Patent Application 0 732868 A1 discloses an organic EL display panel having electrical insulation ramparts 7. Each rampart has an overhanging portion 7a, with various rampart cross sectional views shown in FIGS. 7A–7H of the Nagayama et al. disclosure. Each of these single ramparts separates one set of light emitting portions (or light emitting pixels) from an adjacent set of light emitting portions. Each of the single ramparts serves as an integral deposition mask for forming second display electrodes 9 over an organic function layer 8 disposed over a portion of first display electrodes 3.

The walls of the Tang et al. device, and the ramparts of the Nagayama et al. device, are constructed on a device surface from an electrically insulative material which is patterned by a photolithographic process well known in the art. The process is selected to remove the insulative material from areas extending between neighboring walls or ramparts, leaving behind on the device surface a patterned layer which constitutes the walls or the ramparts.

It has been found that particle residue can become lodged at the base of the walls or against the side of the walls constructed in accordance with the teachings of Tang et al. in the aforementioned U.S. patent, during or subsequent to the wall patterning process. It is anticipated that particle residue can become lodged under the overhanging portions of the Nagayama et al. ramparts. The problem of particle residue can be more readily appreciated from a schematic perspective view shown in FIG. 1A, and from a schematic cross sectional view of FIG. 1B, in which only four walls are depicted for clarity.

In FIG. 1A, three anode electrodes A1–A3 are disposed on a support 12. Four walls W1–W4 of insulative material are shown disposed over the anode electrodes and on the support therebetween, and are positioned orthogonally to the anode electrodes.

A particle defect D is schematically indicated as being lodged against the anode electrode A1 and against an upper edge of the wall W2, respectively.

FIG. 1B is a schematic cross sectional view taken along the line 1B—1B in FIG. 1A, depicts an additional layer of an EL medium 14 overlying the anode electrode A1 and the upper surfaces of the walls. The particle defect D is lodged against the anode electrode A1 and extends to an upper surface of the wall W2. Further indicated are cathode electrodes C1–C4 comprised of a metallic cathode electrode material which has been vapor deposited under a deposition angle $\Theta$ with respect to the side surfaces of the walls whereby the walls serve as an integral mask for selective deposition of laterally separated cathode electrodes, i.e. separated in the absence of the particle defect D.

The particle D causes a deposited organic EL medium layer 14 to extend from the right side of the wall W1 along the anode electrode A1, along and over the defect D, and over the top surface of the wall W2. More importantly, the cathode electrode C1 is connected to the adjacent cathode electrode C2 due to vapor deposition of the electrode material over the EL medium layer in the region overlying the defect D. Effectively, the electrical connection between cathode electrodes C1 and C2 at the defect position causes light emission from pixels P located at the intersection areas between any anode electrode and either cathode electrode C1 or C2 when an electrical potential difference is applied between any anode electrode and either cathode electrode C1 or C2.

By comparison, the defect-free walls W3 and W4 have an associated EL medium layer and associated cathode electrodes C3 and C4 clearly laterally separated from one another.

The problem of light emission from pixels located at the intersection between any anode electrode and either cathode electrode C1 or cathode electrode C2 makes a device pixel useless.

Complete and reliable elimination of particle defects cannot be achieved in the construction of walls or ramparts.

SUMMARY OF THE INVENTION

It is an object of the invention to provide an organic EL image display panel that is insensitive to the problem of particles found in making EL displays which have spaced electrically insulative pedestal strips.

This object is achieved by the construction of an organic electroluminescent (EL) image display panel comprising:
  (a) a light transmissive electrically insulative support;
  (b) a plurality of parallel laterally spaced light transmissive anode electrodes disposed over a surface of the light transmissive electrically insulative support;
  (c) a plurality of laterally spaced electrically insulative pedestal strips formed over said anode electrodes;
  (d) a set of laterally spaced electrically insulative barriers disposed over corresponding pedestal strips, such that portions of each pedestal strip extend laterally beyond each set of barriers, said barriers projecting upwardly over each of said pedestal strips;
  (e) an organic EL medium overlying each of said anode electrodes, said support, the upper surfaces of corresponding barriers, and extending beyond each of the barriers; and (f) a plurality of parallel laterally spaced cathode electrodes overlying said organic EL medium.

BRIEF DESCRIPTION OF THE DRAWINGS

in FIG. 5B one barrier of one set of barriers is connected at one end to a barrier of an adjacent set of barriers; and in FIG. 5C, one barrier of one set of barriers is connected at both ends to a barrier of an adjacent set of barriers.

Since image display panel features such as layer thickness dimensions are frequently in sub-micrometer ranges, the drawings are scaled for case of visualization rather than for dimensional accuracy. Also, for clarity of presentation, the layer or layers forming the organic EL medium has been omitted from the drawings shown in plan view.

DESCRIPTION OF THE PREFERRED EMBODIMENTS

In the following description, like designations refer to like parts or functions. The materials of the organic EL image display panel of the present invention can take any of the forms of conventional organic EL devices, such as those of Tang, U.S. Pat. No. 4,356,429; VanSlyke et al., U.S. Pat. No. 4,539,507; VanSlyke et al., U.S. Pat. No. 4,720,432; Tang et al., U.S. Pat. No. 4,885,211; Tang et al., U.S. Pat. No. 4,769,292; Perry et al, U.S. Pat. No. 4,950,950; Littman et al, U.S. Pat. No. 5,059,861; VanSlyke et al, U.S. Pat. No. 5,047,687; VanSlyke et al., U.S. Pat. No. 5,059,862; and VanSlyke et al., U.S. Pat. No. 5,061,617, the disclosures of which are hereby incorporated by reference.

Figure 1A:
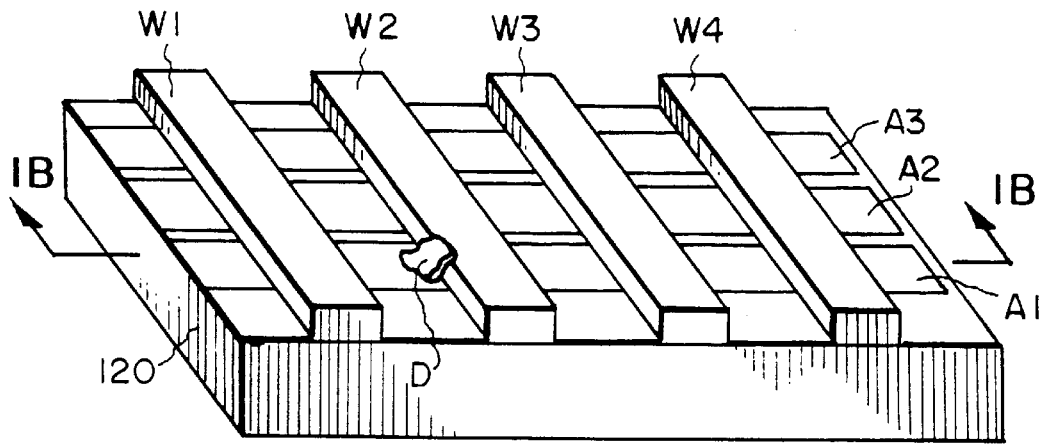
FIG. 1A is a schematic perspective view of a portion of a prior art organic EL image display device depicted in a stage of fabrication and showing a particle "D" being lodged against one of the anode electrodes and against an upper corner of one of the walls.

Referring now to FIG. 1A, there is depicted a schematic perspective view of a portion of a prior art organic EL image display device shown in a stage of fabrication in which single electrically insulative walls W1–W4 have been formed on a surface of a light transmissive support 120 in a direction orthogonal to light transmissive anode electrodes A1–A3. A particle defect D is shown lodged against the anode electrode A1 and against an upper corner of the wall W2. Such particle defects D can be formed, and can become attached to device features such as the walls W, particularly during the construction of the walls. As disclosed in Tang et al., U.S. Pat. No. 5,294,870, in column 5, lines 35–45, a preferred technique for forming the walls involves spin coating a negative working photoresist onto the surface of the support 120 having the anode electrodes thereon. A photolithographic process is used in which a patterned exposure crosslinks the photoresist to an insoluble form in exposed areas while unexposed areas of the photoresist can be removed by pattern development and washing techniques. It is during the pattern development and washing steps that partially insoluble photoresist particles can be formed, and can be attached to or lodged against the surface of the support 120 as well as against side surfaces of the walls W as the walls are being formed.

Figure 1B:
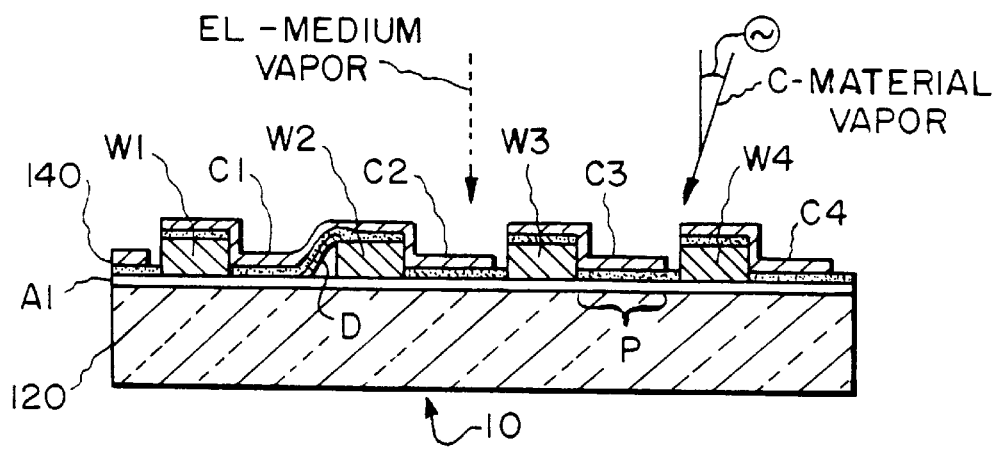
FIG. 1B is a schematic cross section view taken along lines 1B—1B in FIG. 1A, and showing further an EL medium layer and cathode electrodes formed between adjacent walls, as well as formed over the particle defect indicated in FIG. 1A.

Referring now to FIG. 1B, there is shown a schematic cross sectional view depicting a substantially completed construction of a prior art organic EL image display device 10. Briefly described, on a surface of a light transmissive support 120 is shown a light transmissive anode electrode A1, followed in sequence by a layer of an organic EL medium 140 and by cathode electrodes C1–C4. Both the EL medium 140 and the cathode electrodes are formed by vapor deposition, the directions of incidence being indicated by a dotted arrow for the EL medium vapor and by a solid arrow for the cathode material vapor, respectively. The layer of the organic EL medium 140 is formed over the anode electrode A1, over the upper surfaces of the walls W1–W4, and over the particle defect D. The organic EL medium 140 can comprise from two to four stacked layers, with each layer having a thickness dimension in a range from about 100 to about 1000 A. The cathode material vapor is shown by a solid arrow to be incident upon the surface of the device 10 under an angle $\Theta$ with respect to the substantially vertical parallel side surfaces of the walls W1–W4, so that an upper left corner of each of the walls shown in FIG. 1B intercepts the vapor stream, and therefore serves as a deposition mask for forming laterally separated cathode electrodes, particularly evident in cathode electrodes C3 and C4. Due to the cathode electrode deposition conditions, the cathode electrodes are formed over the EL medium 140 to form a light emitting portion of a pixel P in regions where the EL medium 140 is in electrical contact with both a cathode electrode and the anode electrode A1.

In contrast to the laterally separated cathode electrodes C3 and C4, the cathode electrodes C1 and C2 are electrically connected (electrically shorted) at the location of the particle defect D which prevents the upper left corner of the wall W2 from serving as a deposition mask with respect to the incident cathode material vapor. Thus, a single particle defect such as the defect D can cause permanent electrical connection between two adjacent arrangements of light emitting pixels, thereby making the prior art organic EL device 10 functionally useless.

Figure 2A:
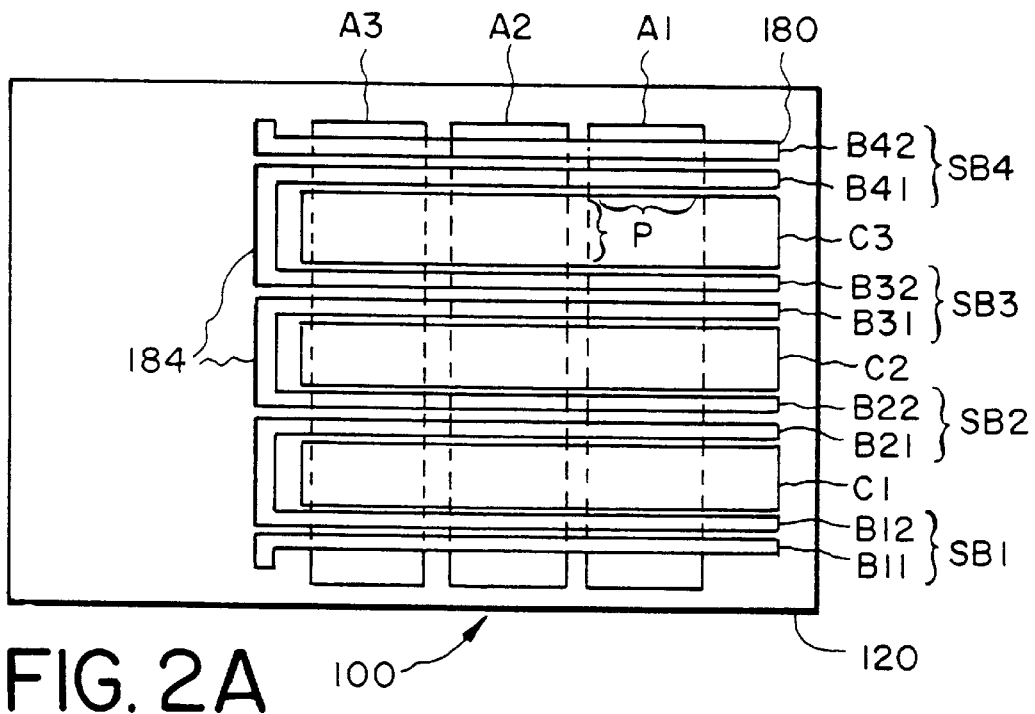
FIG. 2A is a schematic plan view of an organic EL image display panel having a plurality of sets of barriers which laterally separate adjacent cathode electrodes in accordance with the present invention.

Turning now to FIG. 2A, there is shown a schematic plan view of an organic EL image display panel 100 disposed on a light transmissive support 120, and having a plurality of laterally spaced light transmissive anode electrodes A1–A3 formed on a surface of the support 120. A feature of the image display panel 100 is the provision of a plurality of sets of electrically insulative barriers SB1–SB4, with each set of barriers comprised of multiple parallel laterally spaced barriers (for clarity of presentation, only two barriers are shown for each set of barriers). Thus, for example, the set of barriers SB1 includes barriers B11 and B12, and the set of barriers SB4 includes barriers B41 and B42. The sets of barriers are oriented in a direction orthogonal to the anode electrodes A1–A3, and they extend at one termination 180 thereof on the support 120 beyond the anode electrode A1 and at another termination 184 thereof beyond the anode electrode A3. Each set of barriers effectively replaces the single walls W1–W4 of the prior art device shown in FIGS. 1A and 1B, with the sets of barriers substantially eliminating the adverse affect of particle defects, as will be described in more detail with reference to FIG. 3.

Cathode electrodes C1, C2, and C3 are shown as being laterally separated from one another by the corresponding sets of barriers. A light emitting portion of a pixel P is defined as an area of intersection between an anode electrode and a cathode electrode.

Figure 2B:
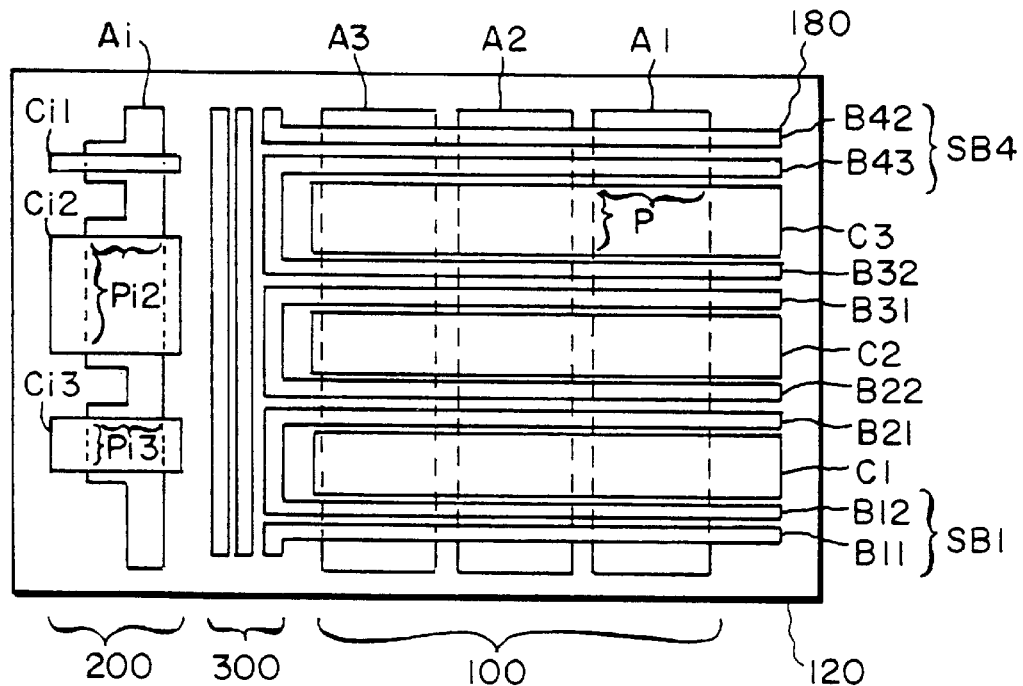
FIG. 2B is a schematic plan view of an organic EL image display panel similar to that shown in FIG. 2A and having further an icon display region separated from the image display panel by multiple electrically insulative barriers, in accordance with the present invention.

Turning now to FIG. 2B, there is shown a schematic plan view of an organic EL image display panel 100 similar to that shown in FIG. 2A, but with the addition of an icon display region 200 on the common light transmissive support 120 for displaying icons and/or alphanumeric information. The icon display region 200 is laterally separated from the image display panel 100 by a set of multiple electrically insulative barriers 300. The icon display region 200 is schematically depicted here as having a common icon display anode Ai which is patterned to provide different sizes or different shapes of icons to be displayed. Individual icon display cathodes Ci1–Ci3 also have a particular area and a particular shape, and overlie an organic EL medium (not shown) formed over portions of the anode electrode Ai.

The terms "barriers", "sets of barriers", and "multiple barriers" have been selected because they describe the performance of these elements in accordance with the invention, namely to be barriers against electrical connection between adjacent cathode electrodes in the presence of a particle defect which causes such electrical connection when single walls or single ramparts are used to affect lateral separation between adjacent cathode electrodes, as described with reference to the prior art device of FIGS. 1A and 1B.

Figure 3:
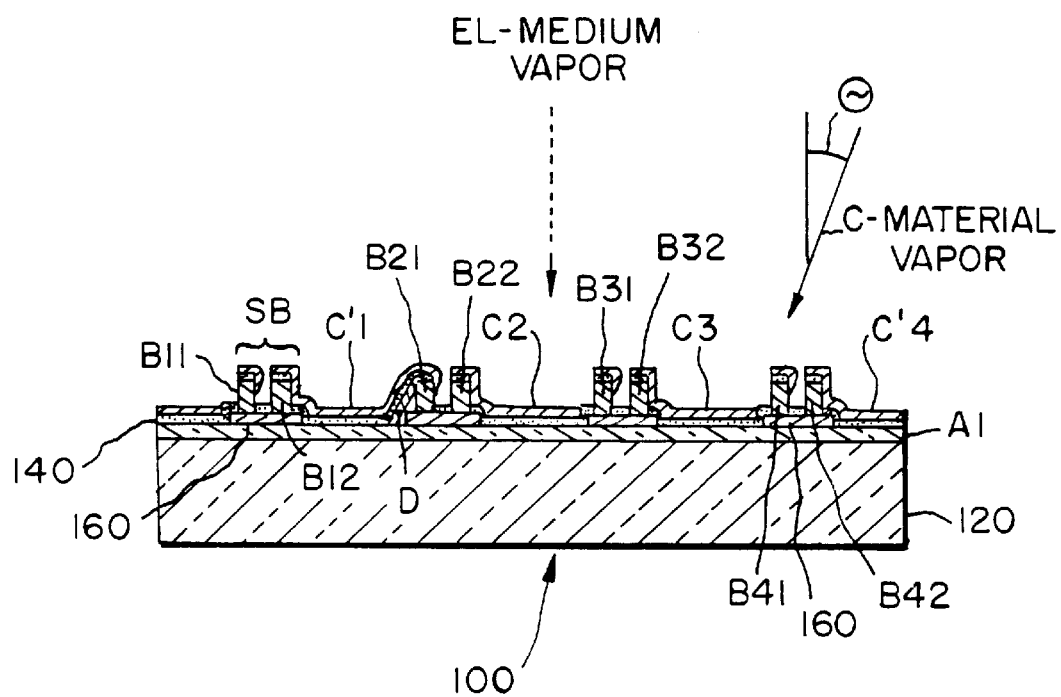
FIG. 3 is a schematic cross section view of a portion of an organic EL image display panel in which sets of electrically insulative barriers have been formed on corresponding electrically insulative pedestal strips disposed over a support surface in accordance with the present invention.

Referring now to FIG. 3, there is shown a schematic cross sectional view of a portion of an image display panel 100 in which sets of electrically insulative barriers SB have been formed on corresponding electrically insulative pedestal strips 160 over an anode electrode A1 on a support 120. With the exception of the pedestal strips 160 and the sets of barriers SB formed thereon, the deposition of the EL medium 140 and of the cathode electrodes C1–C4 from their respective vapor streams is identical to the description given with reference to FIG. 1B.

A particle defect D is depicted being lodged against the barrier B21 at a location substantially similar to the location of the defect in FIG. 1B. However, due to the inventive aspect of the sets of barriers comprised of at least two laterally spaced parallel barriers (for example, barrier B21 and barrier B22), the cathode electrode C1 is laterally separated from the adjacent cathode electrode C2. It will be appreciated that an undesirable electrical connection between cathode electrodes C1 and C2 could only occur if a second particle defect were to be lodged within the lateral spacing between the barrier B21 and the barrier B22, and such second particle defect having similar dimensions to the dimension of the defect D. Stated differently, the sets of at least two barriers would require a spatial coincidence of two particle defects in order to cause an electrical connection between adjacent cathode electrodes.

The electrically insulative pedestal strips 160 are formed on the support 120 and over the anode electrodes such that portions of each pedestal strip extend laterally beyond a set of barriers SB to be formed thereon. A major function of these electrically insulative pedestal strips is to minimize direct electrical contact between a cathode electrode and an anode electrode at base corners of the barriers if the base of a barrier were to be formed directly on the anode electrode, since the EL medium 140 is only about 5000 A in thickness and may be significantly thinner in corner regions due to non-uniformity of deposition in such corners. The electrically insulative pedestal strips can be formed from a patterned photoresist, and alternatively, from patterned inorganic materials such as, for example, silicon dioxide or silicon oxynitride materials. In any event, the electrically insulative pedestal strips are relatively thin, having a thickness in the range from 0.5–2.0 micrometer while the sets of barriers extend upwardly from the pedestal strips by a distance in the range from 5–20 micrometer to serve as effective deposition masks for the deposition of the laterally spaced cathode electrodes and/or the deposition of the EL medium.

Figure 4A:
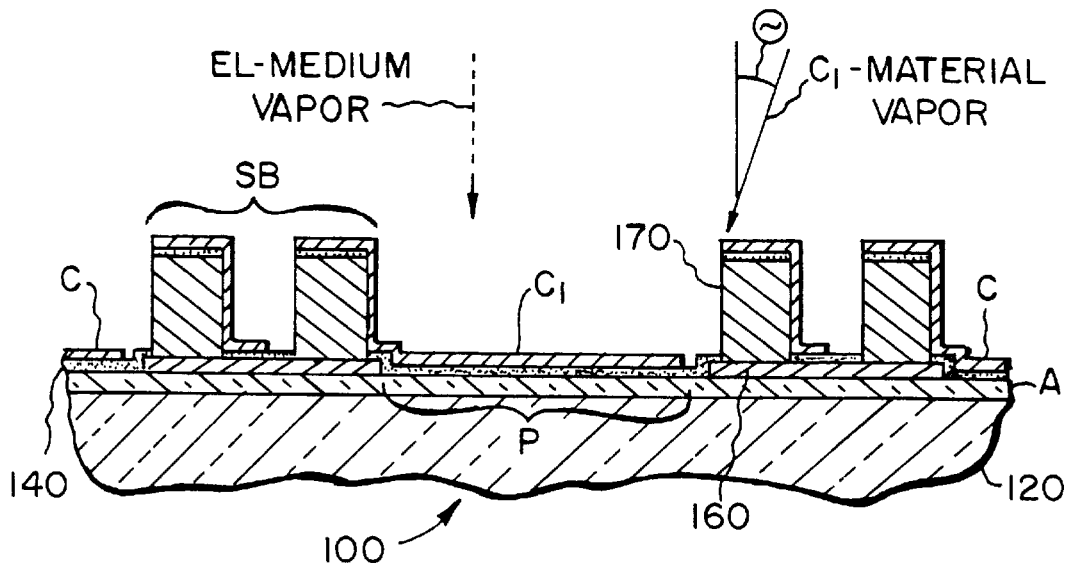
FIG. 4A is an enlarged cross sectional view of one preferred embodiment of a cross sectional shape of sets of multiple barriers of an organic EL image display panel in accordance with the present invention.

Turning now to FIG. 4A, there is shown an enlarged cross sectional view of one preferred embodiment of a cross sectional shape of sets of multiple barriers of an organic EL image display panel, and indicating a light emitting portion of a pixel P. Each barrier of a set SB of at least two barriers has substantially parallel vertical side surfaces 170 projecting upwardly over the pedestal strip 160.

Figure 4B:
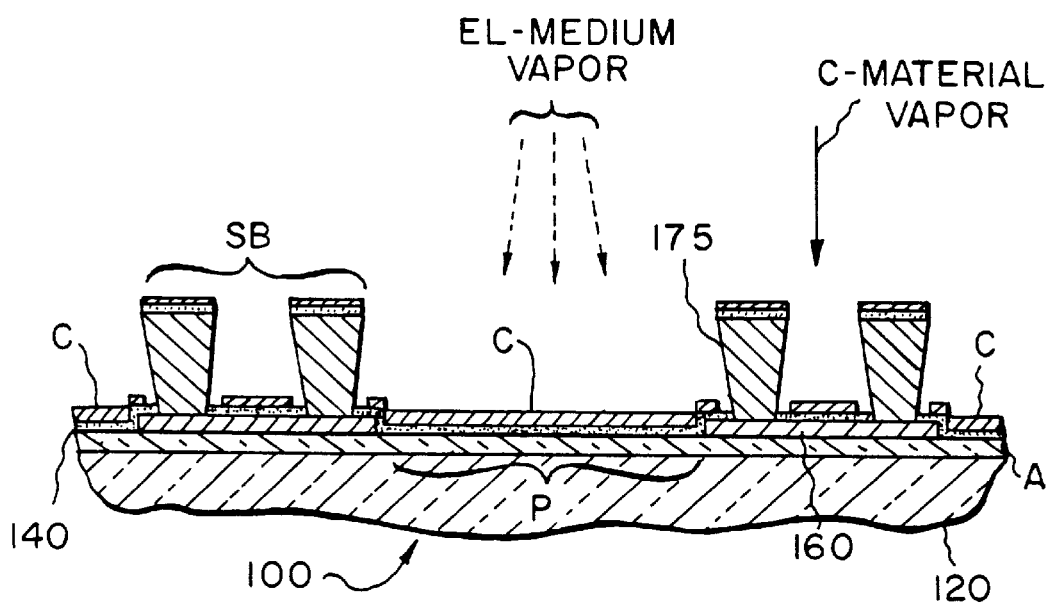
FIG. 4B shows an enlarged cross sectional view of another preferred embodiment of a cross sectional shape of sets of multiple barriers of an organic EL image display panel in accordance with the present invention.

Turning now to FIG. 4B, there is schematically shown an enlarged cross sectional view of another preferred embodiment of a cross sectional shape of sets of multiple barriers of an organic EL image display panel in which each barrier of a set of barriers SB has upwardly diverging side surfaces 175 projecting upwardly over the pedestal strips 160. With this "reentrant" profile of the barriers, the EL medium vapor stream can now be a diverging vapor stream, as schematically indicated by three dotted arrows, and the cathode-material vapor stream is now incident normal to the plane of the support 120 as schematically indicated by the solid arrow. In this configuration, the upper edges of the diverging barriers provide the deposition mask for the deposition of laterally spaced cathode electrodes C.

Each of the barriers shown in FIGS. 4A and 4B have upper surfaces (not otherwise identified) which are substantially parallel with the surface of the support 120 having the anode electrodes A thereon.

Figure 5A:
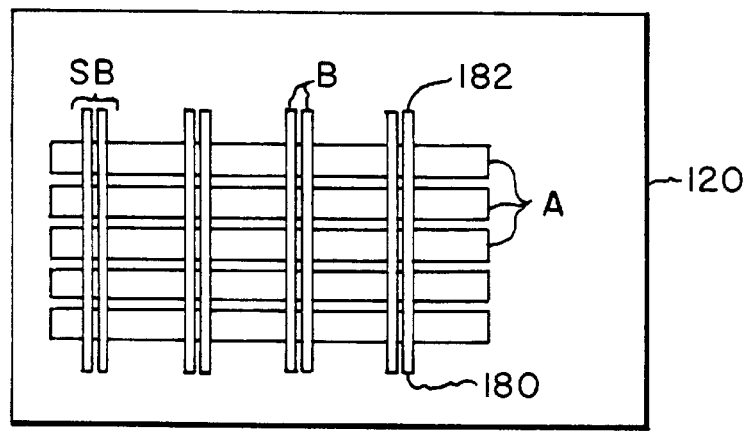
FIGS. 5A–5C show respectively schematic plan views of four different sets of electrically insulative harriers disposed on a support surface, with each set of barriers comprising two relatively closely spaced barriers extending orthogonally with respect to anode electrodes wherein in FIG. 5A each set of barriers is comprised of two parallel bars.
Figure 5B:
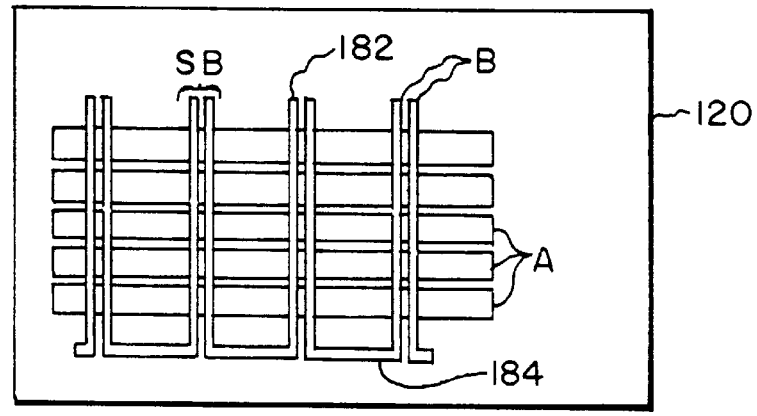
Figure 5C:
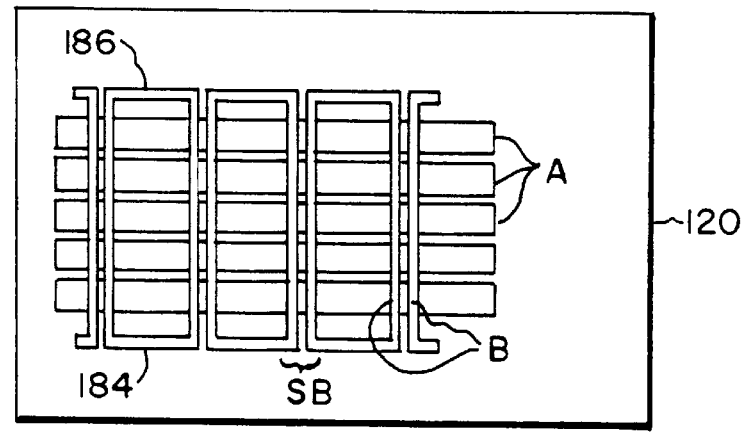

Turning now to FIGS. 5A, 5B, and 5C, there are shown schematic plan views of four sets of electrically insulative barriers disposed on a support 120 in which each set of barriers comprises two relatively closely spaced barriers extending orthogonally with respect to a plurality of anode electrodes A. The sets of barriers SB extend across the plurality of anode electrodes, and have terminations on the support 120 beyond the anode electrodes A. In particular, FIG. 5A shows sets of barriers with each barrier having one termination 180 and another termination 182 disposed on the support 120 in a region beyond the anode electrodes. In FIG.

5B, a barrier of one set of barriers forms a connection 184 to a barrier of an adjacent set of barriers at one termination thereof, with the barriers having another termination 182. In FIG. 5C, a barrier of one set of barriers forms a connection 184 to a barrier of an adjacent set of barriers at one termination thereof and forms a connection 186 at another termination thereof.

In the foregoing description of the preferred embodiments of the invention, the sets of barriers are preferably constructed from a photoresist layer which is patterned to form the barriers by a photolithographic process similar to the process used by Tang et al. in the above referenced U.S. Pat. No. 5,294,870 for construction of the walls in the Tang et al. image display device.

As indicated previously, depending on the linear and area dimensions of a displayed panel, as well as the number and area of light emitting pixels desired in a two-dimensional display panel, the sets of barriers can include more than two closely spaced parallel barriers.

Organic EL image display panels having the sets of multiple barriers can be constructed with an EL medium which provides a monochrome light emission from its pixels. Alternatively, the invention can be practiced by providing sets of multiple barriers in the construction of multi-color or of full-color organic EL image display panels.

The invention has been described in detail with particular reference to certain preferred embodiments thereof, but it will be understood that variations and modifications can be effected within the spirit and scope of the invention.

PARTS LIST

| | |
|---|---|
| A | anode electrode(s) |
| Ai | anode electrode of icon display region |
| B | barrier(s) |
| C | cathode electrode(s) |
| Ci | cathode electrode(s) of icon display region |
| D | particle defect |
| P | light emitting portion of a pixel |
| SB | set of barriers |
| W | wall(s) or rampart(s) (prior art) |
| 10 | organic EL image display panel (prior art) |
| 100 | organic EL image display panel |
| 120 | light transmissive support |
| 140 | organic EL medium |
| 160 | pedestal strip |
| 170 | vertical side surface of a barrier |
| 175 | upwardly diverging side surface of a barrier |
| 180 | termination of barrier(s) |
| 182 | termination of barrier(s) |
| 184 | barrier connection |
| 186 | barrier connection |
| 200 | icon display region |
| 300 | barriers separating region 200 from panel 100 |

What is claimed is:

1. An organic electroluminescent (EL) image display panel comprising:
   (a) a light transmissive electrically insulative support;
   (b) a plurality of parallel laterally spaced light transmissive anode electrodes disposed over a surface of the light transmissive electrically insulative support;
   (c) a plurality of laterally spaced electrically insulative pedestal strips formed over the anode electrodes;
   (d) a set of laterally spaced electrically insulative barriers disposed over corresponding pedestal strips, such that portions of each pedestal strip extend laterally beyond each set of barriers, the barriers projecting upwardly over each of the pedestal strips;
   (e) an organic EL medium overlying each of the anode electrodes, the support, the upper surfaces of corresponding barriers, and extending beyond each of the barriers; and
   (f) a plurality of parallel laterally spaced cathode electrodes overlying the organic EL medium.

2. The organic EL image display panel of claim 1 wherein areas of intersection between the anode electrodes and the cathode electrodes comprise an array of light emitting pixels which can be selectably stimulated to emit light from the EL medium by selectable application of an electrical drive signal between selected anode and cathode electrodes respectively.

3. The organic EL image display panel of claim 1 wherein each barrier of a set of at least two barriers has substantially parallel vertical side surfaces projecting upwardly over the pedestal strip.

4. The organic EL image display panel of claim 1 wherein each barrier of a set of at least two barriers has upwardly diverging side surfaces projecting upwardly over the pedestal strip.

5. The organic EL image display panel of claim 1 further including an icon display region on the light transmissive support wherein the icon display region is laterally separated from the image display panel by a set of at least two parallel electrically insulative barriers.

6. An organic electroluminescent (EL) image display panel comprising:
   (a) a light transmissive electrically insulative support;
   (b) a plurality of parallel laterally spaced light transmissive anode electrodes disposed over a surface of the light transmissive electrically insulative support;
   (c) a plurality of parallel laterally spaced electrically insulative pedestal strips formed over the anode electrodes and the support and oriented in a direction orthogonal to a direction of the anode electrodes;
   (d) a set of at least two parallel laterally spaced electrically insulative barriers disposed over each one of the pedestal strips, such that portions of each pedestal strip extend laterally beyond each set of barriers, the barriers projecting upwardly over the pedestal strips and having upper surfaces which are substantially parallel with the surface of the support having the anode electrodes, each set of barriers forming a deposition mask for subsequent deposition of a cathode electrode;
   (e) an organic EL medium overlying each of the anode electrodes, the support, the upper surfaces of corresponding barriers, the portions of the pedestal strips extending laterally beyond each set of barriers, and between each of the at least two barriers of the set of barriers; and
   (f) a plurality of parallel cathode electrodes overlying the organic EL medium and oriented in a direction orthogonal to the anode electrodes, each one of the plurality of parallel cathode electrodes laterally spaced from adjacent cathode electrodes by vapor deposition of a cathode electrode material, the vapor deposition being intercepted by each barrier forming the deposition mask to provide the laterally spaced cathode electrodes, each set of the barriers substantially ensuring attainment of the laterally spaced cathode electrodes in the presence of a particle defect lodged against any one of the barriers of a set of barriers.

7. The organic EL image display panel of claim 6 wherein areas of intersection between the anode electrodes and the cathode electrodes comprise an array of light emitting pixels which can be selectably stimulated to emit light from the EL medium by selectable application of an electrical drive signal between selected anode and cathode electrodes respectively.

8. The organic EL inage display panel of claim 6 further including an icon display region on the light transmissive support wherein the icon display region is laterally separated from the image display panel by a set of at least two parallel electrically insulative barriers.

9. The organic EL image display panel of claim 6 wherein each barrier of a set of at least two barriers has substantially parallel vertical side surfaces projecting upwardly over the pedestal strip.

10. The organic EL image display panel of claim 6 wherein each barrier of a set of at least two barriers has upwardly diverging side surfaces projecting upwardly over the pedestal strip.

11. The organic EL image display panel of claim 6 wherein each set of barriers is comprised of at least two parallel barriers extending across the plurality of anode electrodes and terminating on the support beyond the anode electrodes.

12. The organic EL image display panel of claim 6 wherein a barrier of one set of barriers forms a connection to a barrier of an adjacent set of barriers at one terminations thereof on the support beyond the anode electrodes.

13. The organic EL image display panel of claim 6 wherein a barrier of one set of barriers forms a connection to a barrier of an adjacent set of barriers at both terminations thereof on the support beyond the anode electrodes.

* * * * *